United States Patent
Seo et al.

(10) Patent No.: US 10,424,346 B2
(45) Date of Patent: Sep. 24, 2019

(54) ELECTRONIC DEVICE INCLUDING MONITORING CIRCUIT AND STORAGE DEVICE INCLUDED THEREIN

(71) Applicant: Samsung Electronics Co., Ltd., Suwon-si, Gyeonggi-do (KR)

(72) Inventors: Sungho Seo, Seoul (KR); Hyuntae Park, Suwon-si (KR); Youngmin Lee, Seoul (KR); Hwaseok Oh, Yongin-si (KR); JinHyeok Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/700,257

(22) Filed: Sep. 11, 2017

(65) Prior Publication Data

US 2018/0096711 A1 Apr. 5, 2018

(30) Foreign Application Priority Data

Oct. 5, 2016 (KR) .......................... 10-2016-0128452

(51) Int. Cl.
*G11C 5/14* (2006.01)
*G11C 7/10* (2006.01)
*G11C 29/02* (2006.01)
*G11C 29/04* (2006.01)

(52) U.S. Cl.
CPC ................ *G11C 5/14* (2013.01); *G11C 5/147* (2013.01); *G11C 7/10* (2013.01); *G11C 29/021* (2013.01); *G11C 29/028* (2013.01); *G11C 2029/0409* (2013.01)

(58) Field of Classification Search
CPC .. G11C 5/14; G11C 5/147; G11C 7/10; G11C 29/021; G11C 29/028; G11C 2029/0409
USPC .......................................................... 365/227
See application file for complete search history.

(56) References Cited

U.S. PATENT DOCUMENTS

| | | | |
|---|---|---|---|
| 5,463,772 | A | 10/1995 | Thompson et al. |
| 6,378,018 | B1 | 4/2002 | Tsem et al. |
| 7,246,252 | B1 | 7/2007 | Gupta et al. |
| 7,380,078 | B2 | 5/2008 | Ikegaya et al. |
| 7,673,089 | B2 | 3/2010 | Hinchey |
| 7,861,107 | B1 | 12/2010 | Coatney et al. |
| 8,560,878 | B2 | 10/2013 | Washiya et al. |
| 8,949,634 | B2 | 2/2015 | Sakagami et al. |
| 9,164,554 | B2 | 10/2015 | Bruening et al. |
| 2005/0138184 | A1 | 6/2005 | Amir |

(Continued)

*Primary Examiner* — Sung Il Cho
(74) *Attorney, Agent, or Firm* — Harness, Dickey & Pierce, P.L.C.

(57) ABSTRACT

An electronic device may include an embedded storage device connected to directly communicate with an extended storage device, and an application processor connected to directly communicate with the embedded storage device and connected to the extended storage device through the embedded storage device. The embedded storage device includes a monitoring device that monitors commands received from the application processor. The monitoring device generates a command state signal representing a state of the embedded storage device and the extended storage device based on a result of monitoring the commands. The embedded storage device operates so that a power supply is controlled in a part or all of the embedded storage device according to the command state signal.

15 Claims, 14 Drawing Sheets

(56) References Cited

U.S. PATENT DOCUMENTS

| | | | |
|---|---|---|---|
| 2007/0168564 A1* | 7/2007 | Conley | G06F 12/0866 710/1 |
| 2008/0205168 A1* | 8/2008 | Pyeon | G06F 13/4247 365/189.14 |
| 2009/0063786 A1 | 3/2009 | Oh | |
| 2011/0314204 A1* | 12/2011 | Ootsuka | G06F 12/0246 711/103 |
| 2012/0124280 A1* | 5/2012 | Oner | G06F 13/1673 711/105 |
| 2013/0019064 A1* | 1/2013 | Kumashikar | G06F 12/126 711/130 |
| 2013/0282957 A1* | 10/2013 | Mylly | G06F 12/0223 711/103 |
| 2014/0068140 A1* | 3/2014 | Mylly | G06F 12/0873 711/102 |
| 2014/0192583 A1* | 7/2014 | Rajan | G11C 7/10 365/63 |
| 2014/0223098 A1* | 8/2014 | Lee | G06F 9/5016 711/118 |
| 2014/0226400 A1* | 8/2014 | Kimura | G06F 1/3225 365/185.08 |
| 2014/0264904 A1* | 9/2014 | Fai | H01L 23/49827 257/774 |
| 2014/0281172 A1 | 9/2014 | Seo et al. | |
| 2014/0281311 A1* | 9/2014 | Walker | G06F 3/0631 711/162 |
| 2014/0325148 A1* | 10/2014 | Choi | G06F 3/0611 711/114 |
| 2014/0372680 A1* | 12/2014 | Tsai | G06F 12/0246 711/103 |
| 2015/0095601 A1* | 4/2015 | Muralimanhar | G06F 13/385 711/163 |
| 2015/0162055 A1* | 6/2015 | Yoo | G11C 5/147 365/226 |
| 2015/0212737 A1* | 7/2015 | Zhu | G06F 3/0604 711/163 |
| 2015/0350086 A1 | 12/2015 | Mullendore et al. | |
| 2016/0034413 A1 | 2/2016 | Park | |
| 2016/0043755 A1 | 2/2016 | Kim et al. | |
| 2016/0092306 A1* | 3/2016 | Benedict | G06F 11/1076 714/764 |
| 2016/0127173 A1 | 5/2016 | Gagnon et al. | |
| 2016/0276034 A1* | 9/2016 | Maejima | G11C 16/10 |
| 2016/0378594 A1* | 12/2016 | Motwani | G11C 29/52 714/764 |
| 2017/0060681 A1* | 3/2017 | Halbert | G06F 11/1068 |
| 2017/0160932 A1* | 6/2017 | Thakkar | G06F 3/061 |
| 2018/0039411 A1* | 2/2018 | Stenfort | G06F 3/061 |
| 2018/0059937 A1* | 3/2018 | Kim | G06F 3/061 |
| 2018/0067539 A1* | 3/2018 | Samson | G06F 1/3287 |

* cited by examiner

ELECTRONIC DEVICE INCLUDING MONITORING CIRCUIT AND STORAGE DEVICE INCLUDED THEREIN

CROSS-REFERENCE TO RELATED APPLICATIONS

This U.S. non-provisional patent application claims priority under 35 U.S.C. § 119 to Korean Patent Application No. 10-2016-0128452, filed on Oct. 5, 2016, the entire contents of which are hereby incorporated by reference.

BACKGROUND

Example embodiments of the inventive concepts relate to a communication between electronic circuits and/or between electronic devices. For example, at least some example embodiments relate to configurations and/or operations of transmitting packets and information for an interface between electronic circuits and/or between electronic devices.

Various types of electronic devices are being used these days. An electronic device performs its own function according to operations of one or more electronic circuits included in the electronic device. An electronic device provides a service to a user by performing its own functions. An electronic device may operate alone to provide a service. Some electronic devices may communicate with other electronic devices and/or external electronic circuits to provide a service.

Examples of electronic devices may include an operation processor and a storage device. The operation processor may communicate (e.g., interface) with the storage device to provide a data storage device to a user. The operation processor may exchange data/information/signals/packets with the storage device while interfacing with the storage device. The operation processor and the storage device may adopt an interface protocol to communicate with each other.

As the demand for an electronic device having higher performance and efficiency increases, a configuration and an interface method of an electronic device have been variously evolved. To implement a storage device having higher capacity, various circuit configurations and operation methods have been suggested. However, in some cases, changing a circuit configuration and an operation method to satisfy a user requirement may cause an increase in a cost, configuration complexity, and a circuit area.

SUMMARY

Example embodiments of the inventive concepts relate to an electronic device.

In some example embodiments, the electronic device may include an application processor; and an embedded storage device configured to directly communicate with both an extended storage device and the application processor such that the application processor is configured to communicate with the extended storage device through the embedded storage device, and to control power supplied to a part or all of the embedded storage device according to a command state signal, the embedded storage device including a monitoring device configured to, monitor commands received from the application processor, and generate the command state signal based on a result of monitoring the commands such that the command state signal indicates a state of the embedded storage device and a state of the extended storage device.

Example embodiments of the inventive concepts also relate to a storage device.

In some example embodiments, the storage device may include a controller configured to directly communicate with both a host device and an external storage device; a nonvolatile memory configured to store or output data under the control of the controller; a monitoring circuit configured to monitor commands received from the host device, and to generate a command state signal indicating a state of the nonvolatile memory and a state of the external storage device based on a result of monitoring the commands; and a power management device configured to adjust an operation power supply to a part of or all of the nonvolatile memory and the controller based on the command state signal.

In some example embodiments, the electronic device may include a processor; and a plurality of storage devices arranged in a chain configuration such that only a first storage device of the plurality of storage devices is directly connected to the processor, the first storage device including a controller configured to, determine which of the plurality of storage devices are associated with an operation of the electronic device based on commands transmitted between the processor and the plurality of storage devices, and selectively disable portions of one or more of the plurality of storage devices based on which of the plurality of storage devices are associated with the operation.

BRIEF DESCRIPTION OF THE FIGURES

Some example embodiments of the inventive concepts will be described below in more detail with reference to the accompanying drawings. The example embodiments of the inventive concepts may, however, be embodied in different forms and should not be constructed as limited to the example embodiments set forth herein. Rather, these example embodiments are provided so that this disclosure will be thorough and complete, and will fully convey the scope of the inventive concepts to those skilled in the art. Like numbers refer to like elements throughout.

DETAILED DESCRIPTION

Below, example embodiments of the inventive concepts may be described in detail and clearly to such an extent that an ordinary one in the art easily implements the inventive concepts.

Figure 1:
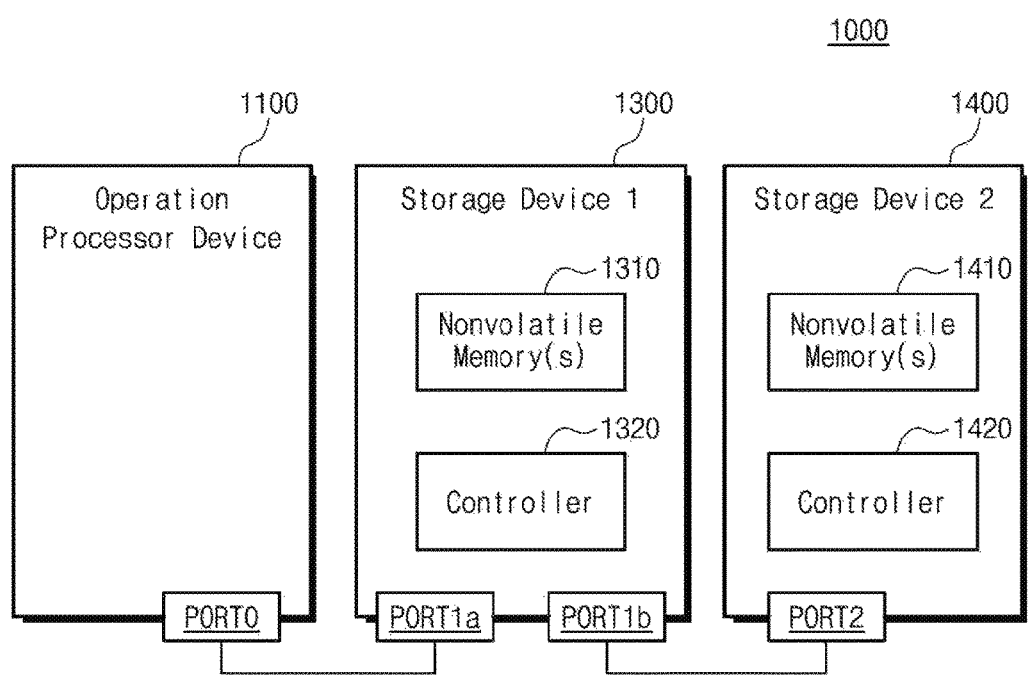
FIG. 1 is a block diagram illustrating a storage system including storage devices serially connected to one another according to example embodiments of the inventive concepts.

FIG. 1 is a block diagram illustrating a storage system including storage devices serially connected to one another according to example embodiments of the inventive concepts.

Referring to FIG. 1, a storage system 1000 may include an operation processing device 1100, a first storage device 1300, and a second storage device 1400, where storage devices 1300, 1400 are serially connected to one another.

The operation processing device 1100 may perform various arithmetic operations/logical operations to manage and process an overall operation of the storage system 1000.

The operation processing device 1100 may be embodied by a circuit for exclusive use (e.g., FPGA (field programmable gate arrays), ASICs (application specific integrated circuits), etc.) including one or more processor cores, or may be embodied by a SoC (system on chip). The operation processing device 1100 may be a processor itself or may be an electronic device or a system including a processor.

The processor may execute instructions that configure the processor as a special purpose processor to control the storage system 1000. Alternatively, the processor may be a processor for exclusive use, and/or an application processor.

The first storage device 1300 may include one or more nonvolatile memories 1310 and a controller 1320. The second storage device 1400 may include one or more nonvolatile memories 1410 and a controller 1420.

The nonvolatile memories (1310, 1410) may include memory areas for storing data. The nonvolatile memories (1310, 1410) may include at least one of various nonvolatile memories such as a NAND-type flash memory, a PRAM (phase-change random access memory), a MRAM (magneto-resistive RAM), a ReRAM (resistive RAM), a FRAM (ferro-electric RAM), etc.

Each of the controllers (1320, 1420) can control an overall operation of a respective one of the storage devices (1300, 1400). To this end, each of the controllers (1320, 1420) may include one or more processor cores (or, alternatively, other processing circuitry) and buffer memories. The processing circuitry may be FPGAs, ASICs, or SoCs.

For example, the controllers (1320, 1420) may control the nonvolatile memories (1310, 1410) respectively so that data is stored in the nonvolatile memories (1310, 1410) and data stored in the nonvolatile memories (1310, 1410) is output.

The operation processing device 1100 may provide a command, a query, and/or a request to the storage devices (1300, 1400). The operation processing device 1100 may exchange data with the storage devices (1300, 1400). In some example embodiments, a command, a query, a request, and data may be transmitted in units of packets. However, example embodiments are not limited thereto and a transmission unit may be variously changed or modified.

When the operation processing device 1100 provides a write command and write data to the storage devices (1300, 1400), the storage devices (1300, 1400) may store the write data in respective ones of the nonvolatile memories (1310, 1410). When the operation processing device 1100 provides a read command to the storage devices (1300, 1400), the storage devices (1300, 1400) may output read data stored in respective ones of the nonvolatile memories (1310, 1410) to the operation processing device 1100.

The operation processing device 1100 may be a host device that receives a storage service from the storage devices (1300, 1400). The "host" may mean a device that receives a service from other devices. According to an operation of the operation processing device 1100, a user of the storage system 1000 may receive a storage service.

In example embodiments of the inventive concepts, the operation processing device 1100 and the storage devices (1300, 1400) may be serially connected to one another. Referring to FIG. 1, the operation processing device 1100 may be directly connected to the first storage device 1300 to directly communicate with the first storage device 1300 through ports (PORT0, PORT1a). Further, the first storage device 1300 may be directly connected to the second storage device 1400 to directly communicate with the second storage device 1400 through ports (PORT1b, PORT2). However, the operation processing device 1100 may not be directly connected to the second storage device 1400 but rather the operating processing device 1100 may be indirectly connected to the second storage device 1400 via the first storage device 1300. Therefore, the operation processing device 1100 and the storage devices (1300, 1400) may be connected to one another in the form of topology of a chain structure or a cascade connection structure.

The controller 1320 may be configured to directly communicate with the operation processing device 1100 to exchange read data and/or write data with the operation processing device 1100. The controllers (1320, 1420) may be configured to directly communicate with each other to exchange read data and write data with each other. In some example embodiments, the controller 1420 may not be directly connected to the operation processing device 1100, but rather the controller 1420 may be indirectly connected to the operation processing device 1100 via the first storage device 1300.

An operation processing device may be directly connected to multiple storage devices, for example, the operation processing device may be connected in parallel with the multiple storage devices. However, in this case, the operation processing device may include additional ports to connect directly to the multiple storage devices. In addition, the operation processing device may include communication circuits and peripheral circuits that drive and control the communication circuits to communicate with the multiple storage devices.

According to the example embodiment illustrated in FIG. 1, the operation processing device 1100 may not directly communicate with the second storage device 1400. Thus, the operation processing device 1100 may include only the port (PORT0) connected to the first storage device 1300, a communication circuit for communicating with the first storage device 1300, and a peripheral circuit that drives and controls the communication circuit. The first storage device 1300 may instead include two ports, namely the port (PORT1a) connected to PORT0 of the operation processing device 1100 and the port (PORT1b) connected to the second storage device 1400, a communication circuit for communicating with the second storage device 1400, and a peripheral circuit that drives and controls the communication circuit.

Thus, according to the example embodiment illustrated in FIG. 1, a configuration of the operation processing device 1100 may become simplified and an area occupied by the operation processing device 1100 may be reduced. In addition, a design/production cost of the operation processing device 1100 may be reduced. In addition to the economic benefits, adopting two storage devices 1300 and 1400 may provide larger storage capacity as compared with adopting one storage device. Thus, a user requirement may be satisfied.

In this example embodiment, a configuration of the first storage device 1300 may be relatively more complicate than a storage device configured to communicate with only one device. However, in numerous cases, the operation processing device 1100 may operate at a speed of several to several tens of GHz and the first storage device 1300 may operate at a speed of several to several tens of MHz. In addition, a process for manufacturing the operation processing device 1100 may be more difficult and complicated than a process for manufacturing the first storage device 1300. Thus, embodying the port (PORT1*b*), the communication circuit, and the peripheral circuit in the first storage device 1300 may be much more simple and economic.

The operation processing device 1100 and the storage devices (1300, 1400) may communicate with each other according to at least one of various interface protocols. For example, the operation processing device 1100 and the storage devices (1300, 1400) may adopt at least one of serial interface protocols such as a USB (universal serial bus), a SCSI (small computer system interface), a PCIe (peripheral component interconnect express), a SATA (serial advanced technology attachment), a SAS (serial attachment SCSI), a SD (secure digital) card, an eMMC (embedded multimedia card), a UFS (universal flash storage) to communicate with each other. However, example embodiments are not limited thereto.

FIGS. 2A through 2D are conceptual diagrams illustrating illustrative example embodiments of a storage system 1000 of FIG. 1.

Figure 2A:
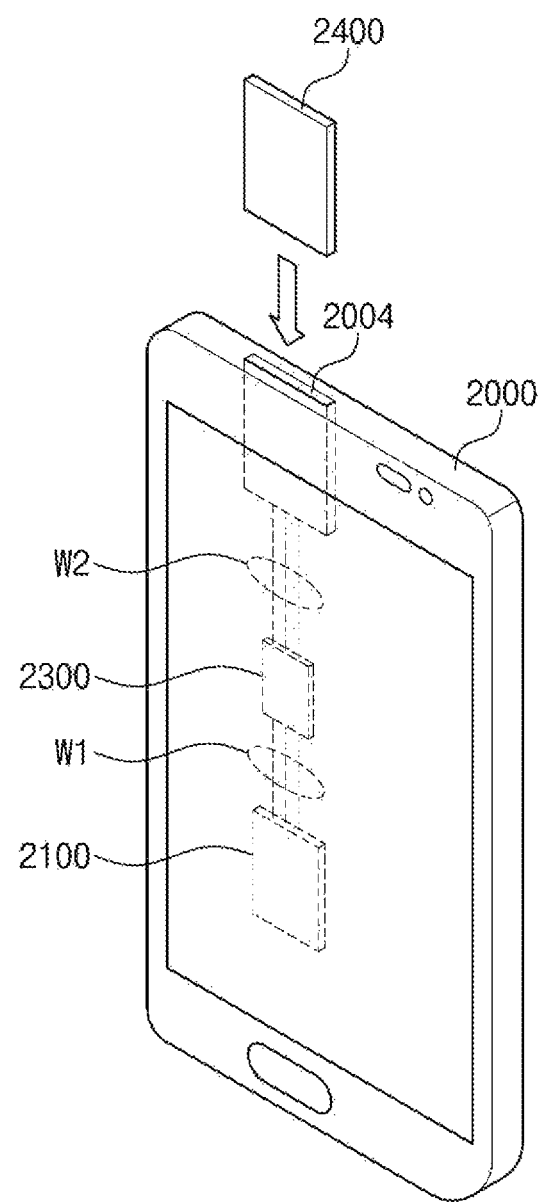
FIGS. 2A through 2D are conceptual diagrams illustrating illustrative embodiments of a storage system of FIG. 1.

Referring to FIG. 2A, the storage system 1000 of FIG. 1 may be embodied in an electronic device (e.g., a smart phone, a tablet computer, etc.) 2000. The electronic device 2000 may include an application processor 2100 and an embedded storage device 2300. The electronic device 2000 may include a slot 2004 to equip a removable storage device 2400. The removable storage device 2400 may be embodied in the form of a card, a stick, or a chip package, and may be equipped in the slot 2004 or be detached from the slot 2004.

The application processor 2100 may be connected to directly communicate with the embedded storage device 2300 through a conductive pattern W1. When the removable storage device 2400 is equipped in the slot 2004, the embedded storage device 2300 may be connected to directly communicate with the removable storage device 2400 through a conductive pattern W2. The removable storage device 2400 may not be directly connected to the application processor 2100, but rather the removable storage device 2400 may be indirectly connected to the application processor 2100 via the embedded storage device 2300.

Figure 2B:
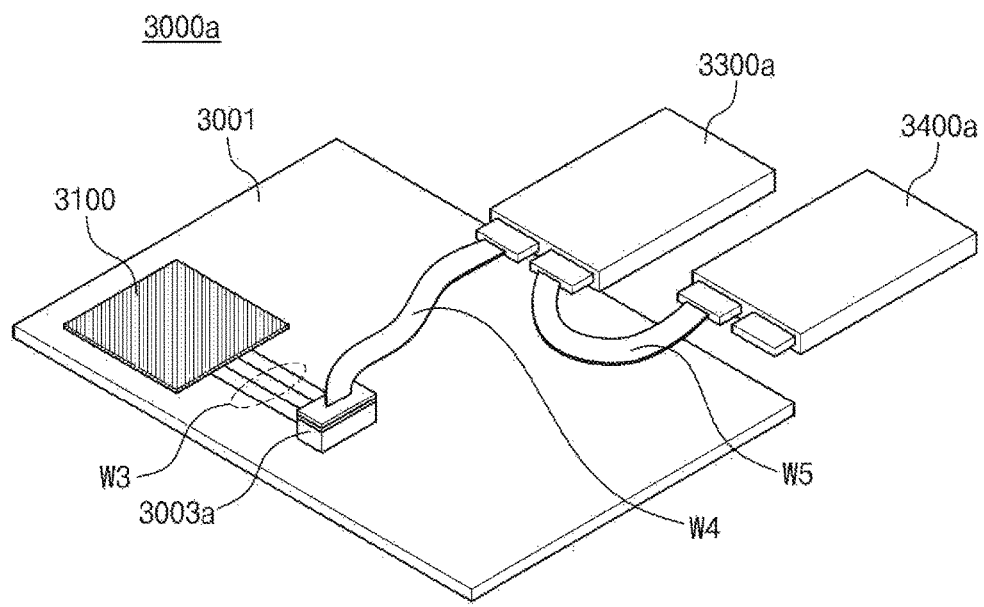
Figure 2C:
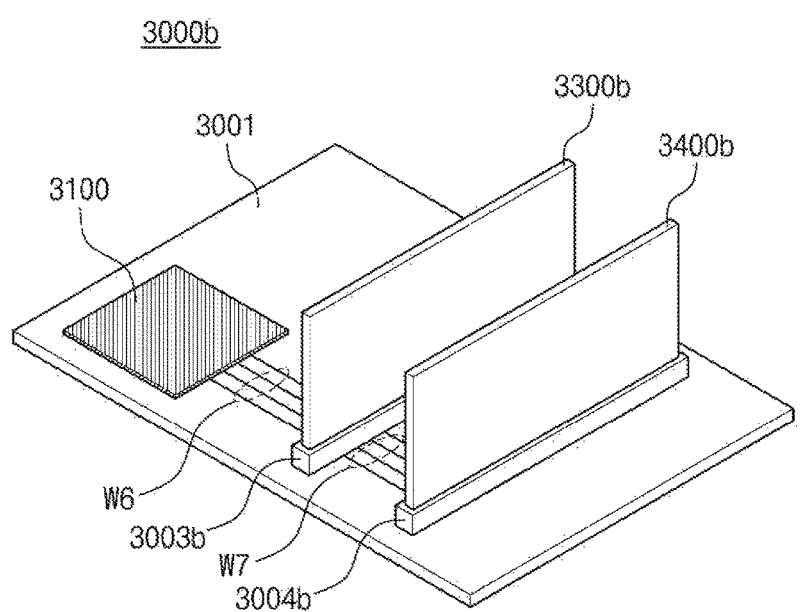
Figure 2D:
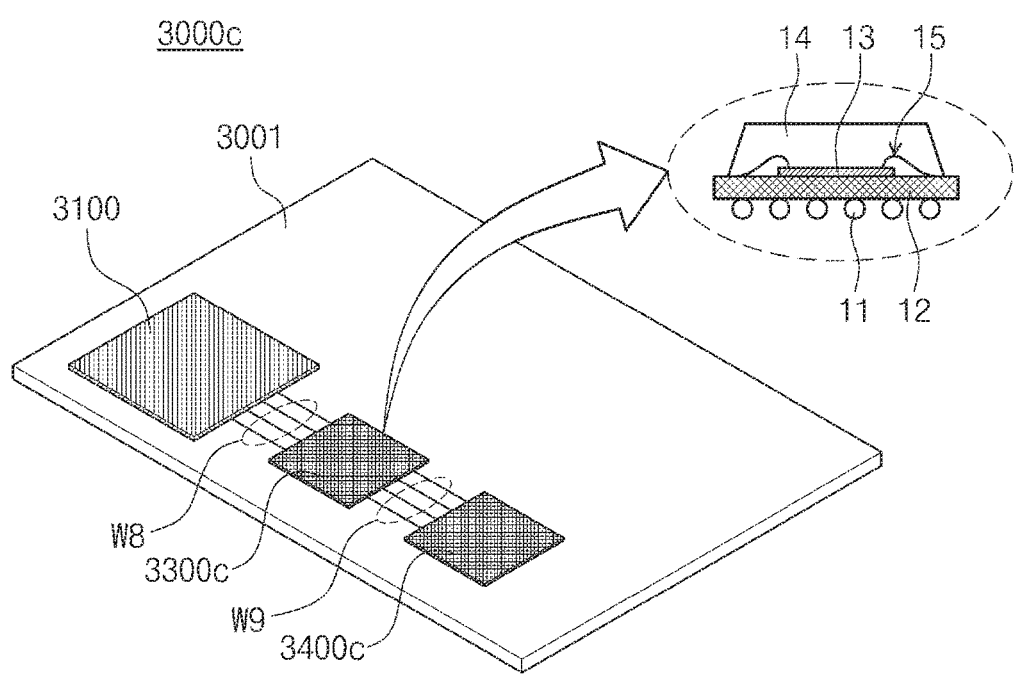

Referring to FIGS. 2B through 2D, the storage system 1000 of FIG. 1 may be embodied in a computing system (3000*a*, 3000*b*, or 3000*c*) (e.g., a desktop computer, a laptop computer, a workstation, a server system, etc.). The computing system 3000*a* of FIG. 2B may include a CPU (central processing unit) 3100 and storage devices (3300*a*, 3400*a*). The CPU 3100 may be equipped on a mainboard (or mother board) 3001.

Each of the storage devices (3300*a*, 3400*a*) may be a HDD (hard disk drive) or a SSD (solid state drive) which is embodied in the form of a box module. The first storage device 3300*a* may be connected to a connector 3003*a* on the mainboard 3001 and may be connected to directly communicate with the CPU 3100 through a conductive pattern W3 and a wire cable W4. The second storage device 3400*a* may be connected to directly communicate with the first storage device 3300*a* through a wire cable W5. The second storage device 3400*a* may not be directly connected to the CPU 3100, but rather the second storage device 3400*a* may be indirectly connected to the CPU 3100 via the embedded storage device 2300.

The computing system 3000*b* of FIG. 2C may include the CPU 3100, the main board 3001 and storage devices (3300*b*, 3400*b*). The CPU 3100 and the main board 3001 may be the same as in FIG. 2B. Each of the storage devices (3300*b*, 3400*b*) may be a memory module or a SSD embodied in the form of a card module. The first storage device 3300*b* may be connected to a connector 3003*b* on the mainboard 3001 and may be connected to directly communicate with the CPU 3100 through a conductive pattern W6. The second storage device 3400*b* may be connected to a connector 3004*b* on the mainboard 3001 and may be connected to directly communicate with the first storage device 3300*b* through a conductive pattern W7. The second storage device 3400*b* may not be directly connected to the CPU 3100, but rather the second storage device 3400*b* may be indirectly connected to the CPU 3100 via the first storage device 3300*b*.

The computing system 3000*c* of FIG. 2D may include the CPU 3100, the main board 3001 and storage devices (3300*c*, 3400*c*). The CPU 3100 and the main board 3001 may be the same as in FIGS. 2B and 2C. Each of the storage devices (3300*c*, 3400*c*) may be an on-board SSD or a BGA (ball grid array) SSD embodied in the form of a chip or a chip package. The first storage device 3300*c* may be connected to directly communicate with the CPU 3100 through a conductive pattern W8 and may be connected to directly communicate with the second storage device 3400*c* through a conductive pattern W9. The second storage device 3400*c* may not be directly connected to the CPU 3100, but rather the second storage device 3400*c* may be indirectly connected to the CPU 3100 via the first storage device 3300*c*.

When the first storage device 3300*c* is a BGA SSD, the first storage device 3300*c* may include a nonvolatile memory/controller chip 13 mounted on the substrate 3001. The nonvolatile memory/controller chip 13 may be connected to the conductive patterns (W8, W9) through a bonding wire 15 and may be covered with a mold compound 14. The first storage device 3300*c* may be mounted on the mainboard 3001 through solder balls 11.

In some example embodiments, each of the computing systems (3000*a*, 3000*b*, 3000*c*) may further include a working memory for temporarily storing data processed or to be processed by the CPU 3100, a communication circuit for communicating with an external device/system, and a user interface for exchanging data/information with a user. The working memory, the communication circuit, and the user interface may be mounted on the main board 3001 and may be connected to the CPU 3100 through the conductive patterns and/or buses.

In FIGS. 2A through 2D, each of the application processor 2100 and the CPU 3100 may correspond to the operation processing device 1100 of FIG. 1. The embedded storage device 2300 and each of the first storage devices (3300*a*, 3300*b*, 3300*c*) may correspond to the first storage device 1300 of FIG. 1. The removable storage device 2400 and each of the second storage devices (3400*a*, 3400*b*, 3400*c*) may correspond to the second storage device 1400 of FIG. 1. As described with reference to FIG. 1, configurations of FIGS. 2A through 2D may bring economic benefits while satisfying user demand.

The conductive patterns (W1, W2, W3, W6, W7, W8, W9) may be conductive material formed on a PCB (printed circuit board) or the main board 3001. Each of the conductive patterns (W1, W2, W3, W6, W7, W8, W9) may include a wire pattern, a trace pattern, etc. The conductive material may be embodied by a wire, a trace, a conductive plate, etc.

Figure 3:
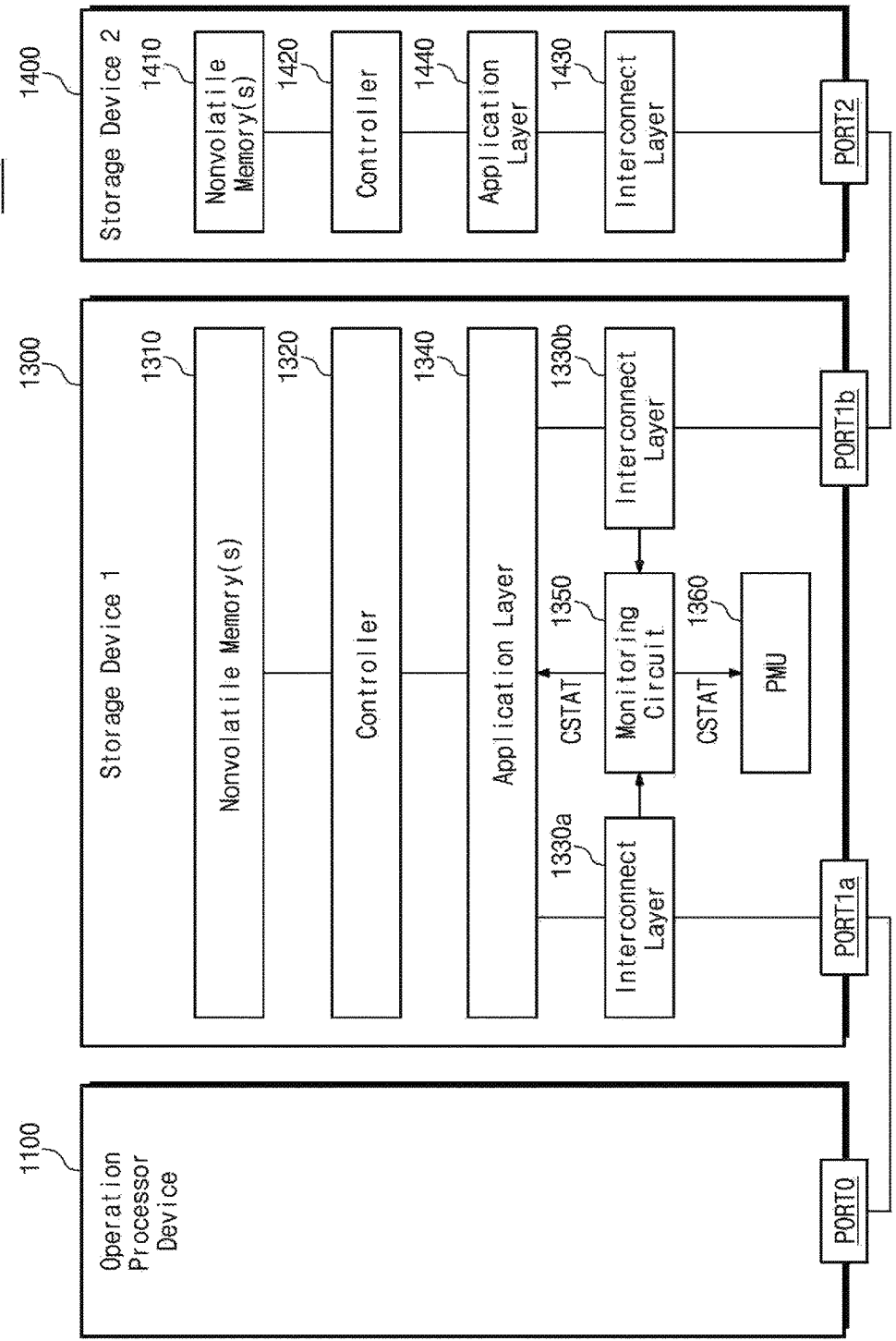
FIG. 3 is a block diagram illustrating a storage system including a monitoring circuit according to example embodiments of the inventive concepts.

FIG. 3 is a block diagram illustrating a storage system 1000 including a monitoring circuit 1350 according to example embodiments of the inventive concepts.

Referring to FIG. 3, in some example embodiments, the first storage device 1300 may further include interconnect layers (1330a, 1330b), an application layer 1340, a monitoring circuit 1350, and a power management unit (PMU) 1360.

The interconnect layer 1330a may transmit/receive data/signals/packets through the port (PORT1a) and the interconnect layer 1330b may transmit/receive data/signals/packets through the port (PORT1b). The interconnect layers (1330a, 1330b) may include a physical layer and a link layer defined in an interface protocol adopted by the first storage device 1300. The interconnect layers (1330a, 1330b) may include various hardware configuration elements such as one or more of a transmission/reception circuit, a modulation/demodulation circuit, a converter circuit, a buffer circuit, etc.

The application layer 1340 may understand and process various commands/packets of the interface protocol adopted by the first storage device 1300. The application layer 1340 may provide a communication service on the first storage device 1300 by processing the interface protocol for the controller 1320. The application layer 1340 may include various hardware circuits to process the interface protocol. Add to this or alternatively, the application layer 1340 may be embodied by an instruction set of a program code executed by a processor core, for example, the processor core of the controller 1320.

The application layer 1340 may convert and process various commands/packets so that a communication between the operation processing device 1100 and the second storage device 1400 is allowed. The application layer 1340 may analyze a request received from the operation processing device 1100. The application layer 1340 may determine whether the received request is to be processed in the first storage device 1300 or whether the received request is associated with a setting or a change of a communication environment of the second storage device 1400. When the received request is associated with a setting or a change of a communication environment of the second storage device 1400, the application layer 1340 may change a data format of the received request to a format that can be processed in the second storage device 1400 to provide the changed data format.

In some example embodiments, the second storage device 1400 may further include an interconnect layer 1430 and an application layer 1440. The interconnect layer 1430 may transmit and receive data/signal/packet through the port (PORT2). The application layer 1440 may understand and process various commands/packets of an interface protocol adopted by the second storage device 1400. The interconnect layer 1430 and the application layer 1440 may be constituted similar to the interconnect layer 1330a and the application layer 1340 respectively.

FIG. 3 illustrates that the interconnect layers (1330a, 1330b, 1430) and the application layers (1340, 1440) are independent configuration elements. This configuration is provided to help better understanding of the inventive concepts and is not to limit example embodiments of the inventive concepts. In some example embodiments, the interconnect layers (1330a, 1330b) and/or the application layer 1340 may be included in the controller 1320 and the interconnect layer 1430 and/or the application layer 1440 may be included in the controller 1420.

The operation processing device 1100 may communicate with the first storage device 1300 (e.g., store data in the first storage device 1300 or read data from the first storage device 1300) by transmitting a command and/or data to the application layer 1340 of the first storage device 1300 through the ports (PORT0, PORT1a) and the interconnect layer 1330a. The controller 1320 may store data in the nonvolatile memories 1310 or read data from the nonvolatile memories 1310 based on the information processed by the application layer 1340. The read data may be provided to the operation processing device 1100 through the interconnect layer 1330a and the ports (PORT1a, PORT0).

The operation processing device 1100 may communicate with the second storage device 1400. However, since the operation processing device 1100 may not be directly connected to the second storage device 1400, the operation processing device 1100 may provide a command and/or data constituted for the second storage device 1400 to the first storage device 1300 through the ports (PORT0, PORT1a) and the interconnect layer 1330a. The first storage device 1300 may transmit the provided command and/or data to the second storage device 1400 through the interconnect layer 1330b and the ports (PORT1b, PORT0).

The second storage device 1400 may receive the command/data from the first storage device 1300 through the interconnect layer 1430. The controller 1420 may store data in the nonvolatile memories 1410 or may read data from the nonvolatile memories 1410 based on information processed by the application layer 1440. The read data may be provided to the first storage device 1300 through the interconnect layer 1430 and the ports (PORT2, PORT1b). The first storage device 1300 may receive data from the second storage device 1400 through the interconnect layer 1330b. The first storage device 1300 may transmit the received data to the operation processing device 1100 through the application layer 1340, the interconnect layer 1330a, and the ports (PORT1a, PORT0).

In some cases, the operation processing device 1100 may perform an operation that only requires the second storage device 1400 without an operation being performed in the first storage device 1300. In this case, continuously operating all of the configuration elements of the first storage device 1300 may cause an increase of unnecessary power consumption. Thus, in example embodiments of the inventive concepts, in some cases, the storage system 1000 may deactivate configuration elements of the first storage device 1300.

Alternatively, the operation processing device 1100 may perform an operation that only requires the first storage device 1300 without an operation performed in the second storage device 1400.

To determine whether to deactivate configuration elements of the first storage device, the monitoring circuit 1350 may detect a command (hereinafter, "a first storage command") processed in the first storage device 1300 and a command (hereinafter, "a second storage command") transmitted to the second storage device 1400. The monitoring circuit 1350 may detect a processing state of the first storage command and the second storage command. The monitoring circuit 1350 may generate a command state signal CSTAT that indicates a state of the first storage device 1300 and the second storage device 1400 based on a reception state and a processing state of the first storage command and the second storage command. The command state signal CSTAT may indicate one of a use state and an idle state associated with one or more of the first storage device 1300 and the second storage device 1400. The command state signal CSTAT may be transmitted to the power management unit 1360 and the application layer 1340.

The power management unit 1360 may deactivate some or all of the configuration elements of the first storage device 1300 based on the command state signal CSTAT.

For example, when the command state signal CSTAT indicates that only the first storage device 1300 is only in a use state and the second storage device 1400 is not in a use state, the power management unit 1360 may deactivate configuration elements of the first storage device 1300 associated with transmission of a command and/or data processed in the second storage device 1400. Further, in some example embodiments, the application layer 1340 may generate a command that deactivates the second storage device 1400, and may transmit the command to the second storage device 1400 through the interconnect layer 1330b.

For example, the power management unit 1360 may deactivate configuration elements using a method such as a cut off of a clock supply, a supply of a slow clock, or an operation voltage drop.

In contrast, when the command state signal CSTAT indicates that only the second storage device 1400 is in a use state and the first storage device 1300 is not in a use state, the power management unit 1360 may deactivate configuration elements of the first storage device 1300 associated with processing a command and/or data corresponding to the first storage device 1300.

Thus, the storage system 1000 may deactivate configuration elements being in an idle state to minimize unnecessary power consumption.

FIG. 3 illustrates that the monitoring circuit 1350 is an independent configuration element. However, the monitoring circuit 1350 may be included in the interconnect layers (1330a, 1330b) and/or the application layer 1340 in some example embodiments.

Figure 4:
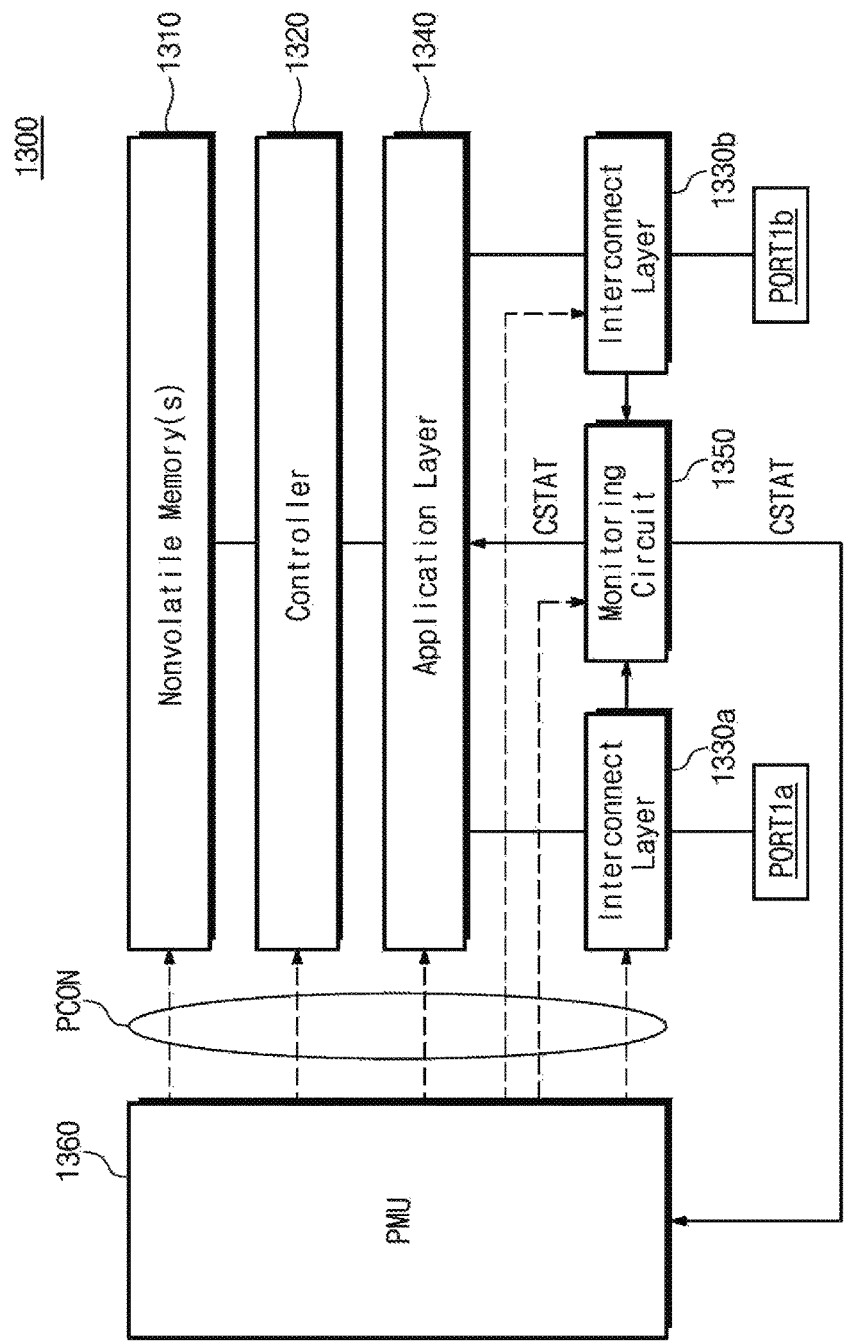
FIG. 4 is a block diagram for explaining a power management operation of a first storage device of FIG. 3.

FIG. 4 is a block diagram for explaining a power management operation of a first storage device 1300 of FIG. 3.

Referring to FIG. 4, the power management unit 1360 may receive the command state signal CSTAT from the monitoring circuit 1350. The command state signal CSTAT may indicate a use state of the storage devices (1300, 1400).

As described in FIG. 3, the monitoring circuit 1350 may detect a first storage command and a second storage command. The monitoring circuit 1350 may also detect a processing state of the first storage command and the second storage command. The monitoring circuit 1350 may generate the command state signal CSTAT that indicates a state of the first storage device 1300 and the second storage device 1400 based on a receiving state and the processing state of the first storage command and the second storage command, and the monitoring circuit 1350 may transmit the generated command state signal CSTAT to the power management unit 1360.

The power management unit 1360 may generate a power control signal PCON based on the command state signal CSTAT. The power control signal PCON may be transmitted to each configuration element of the first storage device 1300. Each of configuration elements of the first storage device 1300 may be independently deactivated according to the power control signal PCON. The power management unit 1360 may deactivate the configuration elements of the first storage device 1300 using a method such as a cut off of a clock supply, a supply of a slow clock, or an operation voltage drop.

When the command state signal CSTAT indicates that only the first storage device 1300 is in a use state and the second storage device 1400 is not in a use state (e.g., an idle state), the power management unit 1360 may generate the power control signal PCON to deactivate a part of the application layer 1340 (e.g., a part that converts a command received from the operation processing device 1100 to transmit it to the second storage device 1400) and the interconnect layer 1330b. In this case, before the interconnect layer 1330b is deactivated, the application layer 1340 may generate a command that deactivates the second storage device 1400, and transmit the command to the second storage device 1400 through the interconnect layer 1330b.

When the command state signal CSTAT indicates that only the second storage device 1400 is in a use state and the first storage device 1300 is not in a use state (e.g., an idle state), the power management unit 1360 may generate the power control signal PCON to deactivate the nonvolatile memories 1310 and the controller 1320.

When the command state signal CSTAT indicates that all of the storage devices (1300, 1400) are in an idle state, the power management unit 1360 may deactivate all the configuration elements of the first storage device 1300 except the interconnect layer 1330a that receives a command from the operation processing device 1100. However, the example embodiments of the power management unit are provided to help better understanding of the inventive concepts and are not to limit the example embodiments of the inventive concepts.

Figure 5:
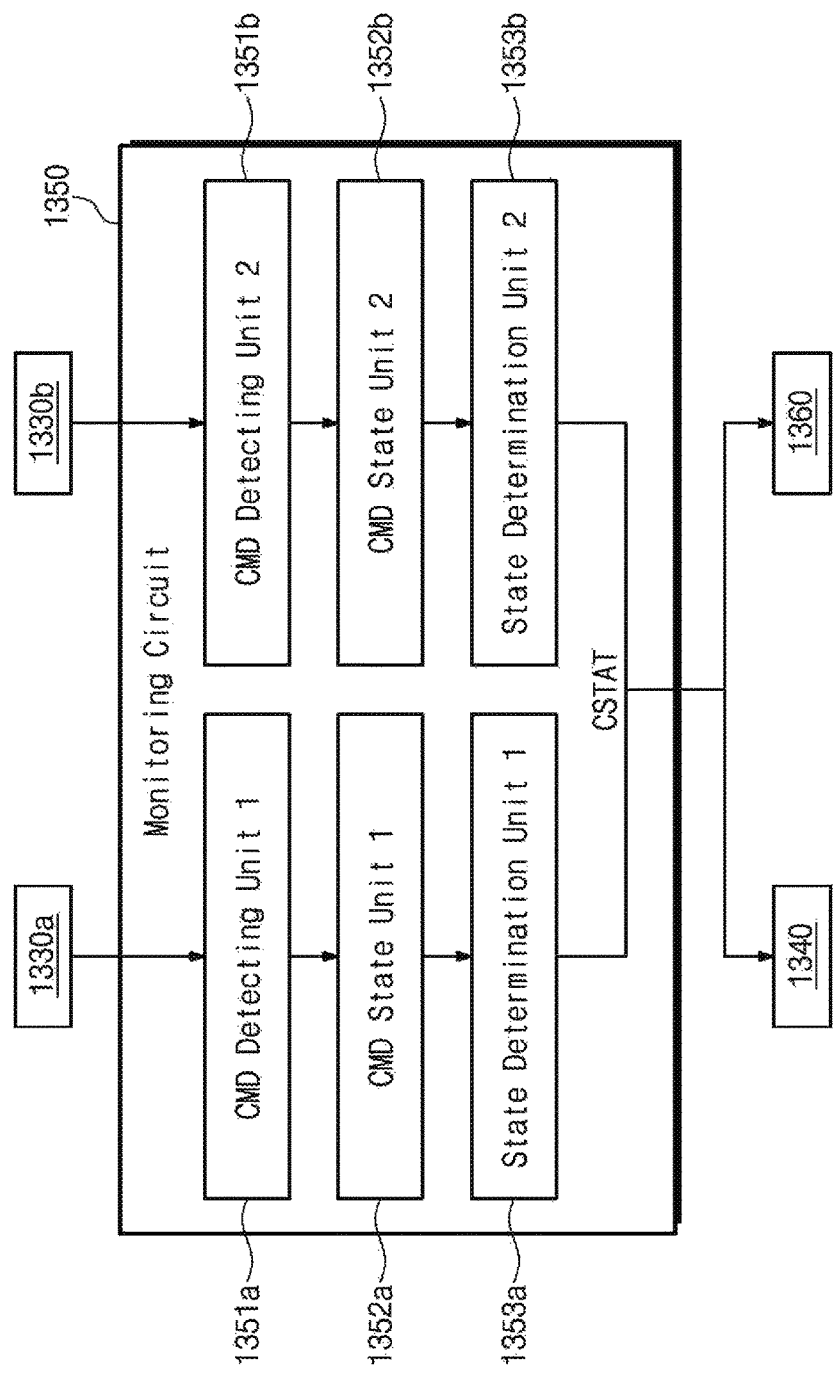
FIG. 5 is a block diagram illustrating a monitoring circuit of FIG. 4 in detail.

FIG. 5 is a block diagram illustrating a monitoring circuit 1350 of FIG. 4 in detail.

Referring to FIG. 5, the monitoring circuit 1350 may include first and second command detection units (1351a, 1351b), first and second command state units (1352a, 1352b), and first and second state determination units (1353a, 1353b). For example, as discussed above, in some example embodiments, the controller 1320 may be programmed to perform the functions of the monitoring circuit 1350, and in turn, the functions of the aforementioned sub-components of the monitoring circuit 1350.

The monitoring circuit 1350 may be individually connected to the interconnect layers (1330a, 1330b). The monitoring circuit 1350 may be connected to the interconnect layer 1330a to monitor a command processing state of the first storage device 1300. The first command detection unit (CMD Detecting Unit 1) 1351a may detect a command processed in the first storage device 1300. The first command detection unit 1351a may also detect a processing state of the detected command. The first command detection unit 1351a may store the command processed in the first storage device 1300 and a processing state of the command in the first command state unit (CMD State Unit 1) 1352a. The first command state unit 1352a may be implemented in the form of a resistor but is not limited thereto. The first state determination unit (State Determination Unit 1) 1353a may generate the command state signal CSTAT that indicates whether to activate or deactivate the first storage device 1300 based on information stored in the first command state unit 1352a. The generated command state signal CSTAT is transmitted to the power management unit 1360 and the application layer 1340 to be used in a power management operation of the first storage device 1300.

The monitoring circuit 1350 may be connected to the interconnect layer 1330*b* to monitor a command processing state of the second storage device 1400. The second command detection unit (CMD Detecting Unit 2) 1351*b* may detect a command processed in the second storage device 1400. The second command detection unit 1351*b* may also detect a processing state of the detected command. The second command detection unit 1351*b* may store the command processed in the second storage device 1400 and a processing state of the command in the second command state unit (CMD State Unit 2) 1352*b*. The second command state unit 1352*b* may be implemented in the form of a resistor but is not limited thereto. The second state determination unit (State Determination Unit 2) 1353*b* may generate a command state signal CSTAT that determines whether to activate or deactivate the second storage device 1400 based on information stored in the second command state unit 1352*b*. The generated command state signal CSTAT is transmitted to the power management unit 1360 and the application layer 1340 to be used in a power management operation of the second storage device 1400.

Figure 6:
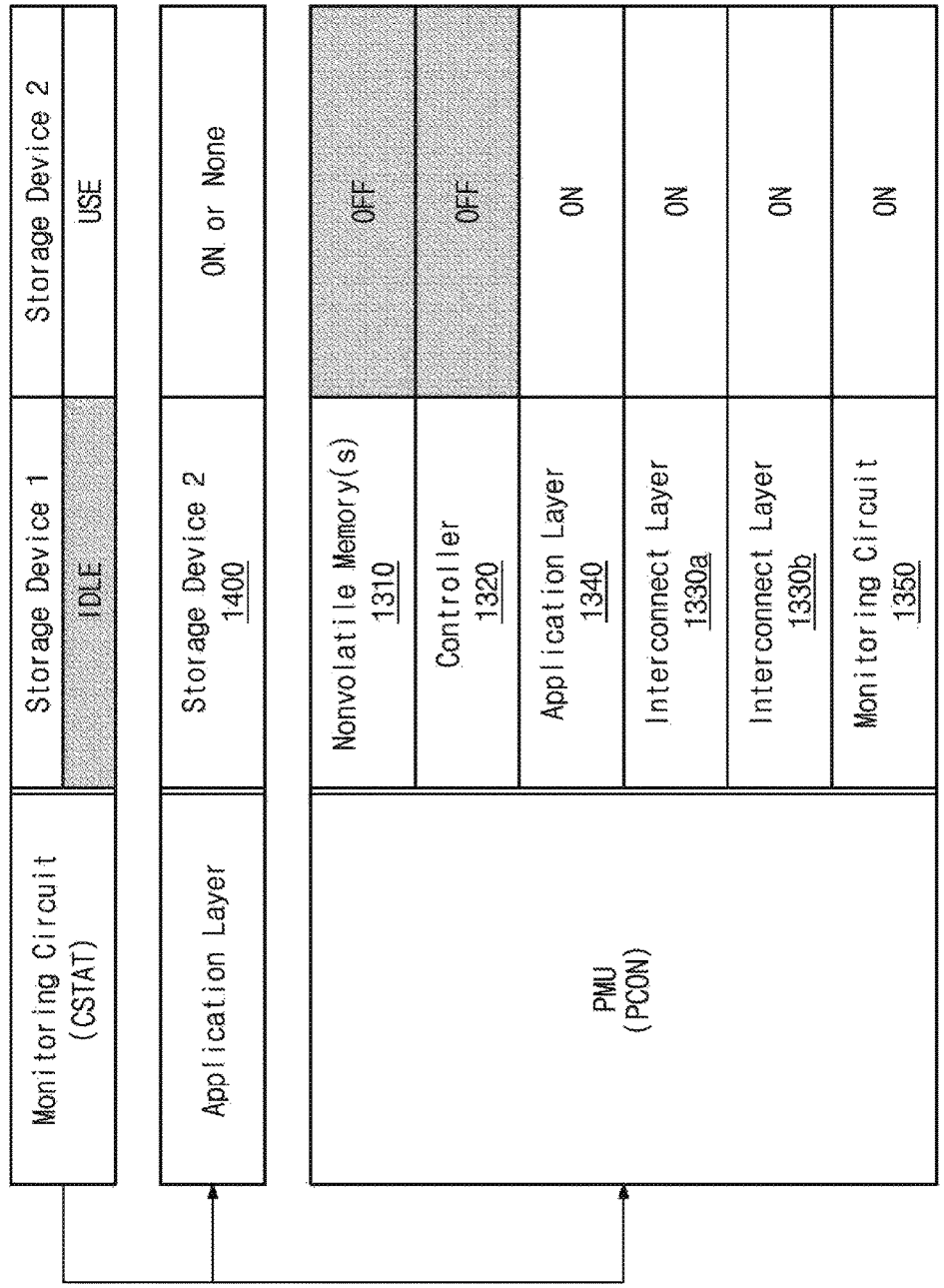
FIGS. 6 through 8 are views for explaining a power management operation of a first storage device according to example embodiments of the inventive concepts.
Figure 7:
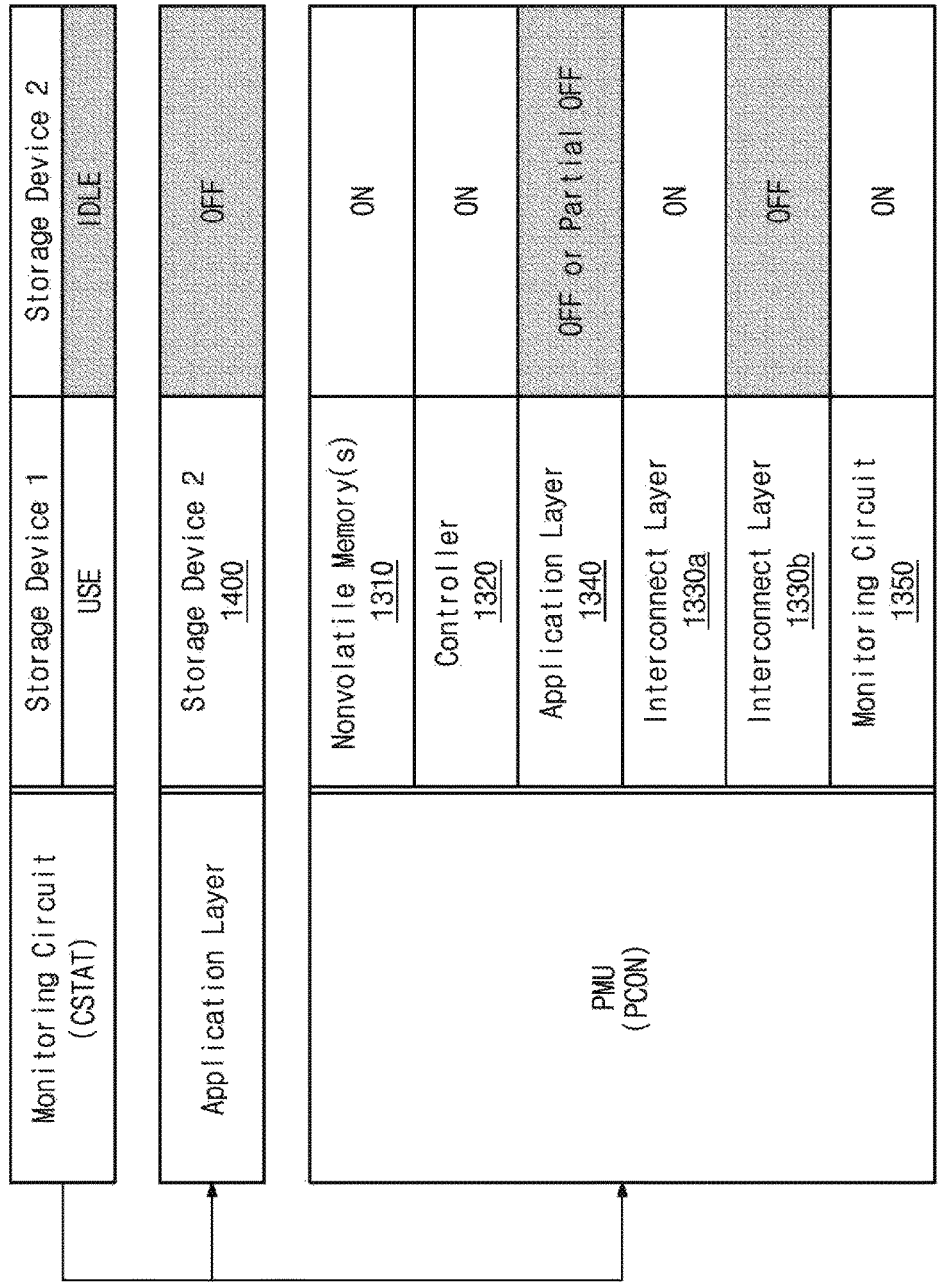
Figure 8:
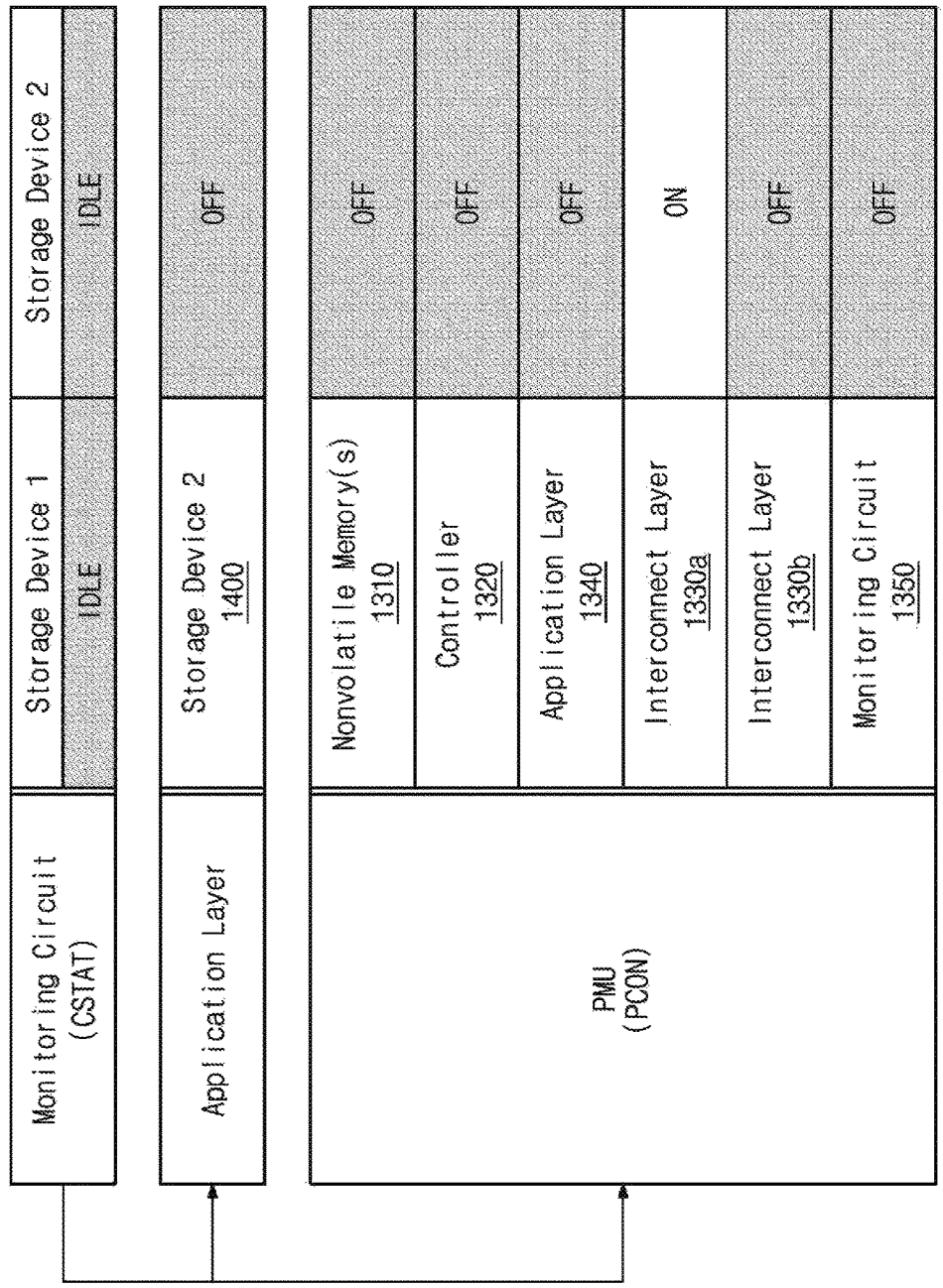

FIGS. 6 through 8 are views for explaining a power management operation of a first storage device 1300 according to example embodiments of the inventive concepts.

Referring to FIG. 6, FIG. 6 illustrates a case where the operation processing device 1100 requires only an operation performed in the second storage device 1400 without an operation performed in the first storage device 1300.

In this case, the monitoring circuit 1350 may output a command state signal CSTAT that indicates an idle state with respect to the first storage device ("Storage Device F") 1300 and a use state with respect to the second storage device ("Storage Device 2") 1400.

In response to receiving the command state signal CSTAT, the application layer 1340 may transmit a command instructing the second storage device 1400 to activate (e.g., turn ON) or, alternatively, may not transmit any command.

In response to receiving the command state signal CSTAT, the power management unit 1360 may generate a power control signal PCON corresponding thereto. The power management unit 1360 may deactivate (e.g., turn OFF) the nonvolatile memories 1310 and the controller 1320. The power management unit 1360 may deactivate the nonvolatile memories 1310 and the controller 1320 using a method such as a cut off of a clock supply, a supply of a slow clock, or an operation voltage drop.

Referring to FIG. 7, FIG. 7 illustrates a case where the operation processing device 1100 requires only an operation performed in the first storage device 1300 without an operation performed in the second storage device 1400. In this case, the monitoring circuit 1350 may output a command state signal CSTAT that indicates a use state with respect to the first storage device 1300 and an idle state with respect to the second storage device 1400.

In response to receiving the command state signal CSTAT, the application layer 1340 may transmit a command instructing the second storage device 1400 to deactivate (e.g., turn OFF). In response to the command, the second storage device 1400 may change to a mode in which power consumption is minimized until another command is received.

In response to receiving the command state signal CSTAT, the power management unit 1360 may generate a power control signal PCON corresponding thereto. The power management unit 1360 may deactivate (e.g., turn OFF) a part (e.g., a part that converts a command received from the operation processing device 1100 to transmit the received command to the second storage device 1400) or all of the application layer 1340 and the interconnect layer 1330*b*.

Referring to FIG. 8, FIG. 8 illustrates a case where the operation processing device 1100 does not request any operation performed in the storage devices (1300, 1400). In this case, the monitoring circuit 1350 may output a command state signal CSTAT indicating an idle state with respect to all of the storage devices (1300, 1400).

In response to receiving the command state signal CSTAT, the application layer 1340 may transmit a command to deactivate (e.g., turn OFF) the second storage device 1400. In response to the command, the second storage device 1400 may change to a mode in which power consumption is minimized until another command is received.

In response to receiving the command state signal CSTAT, the power management unit 1360 may generate a power control signal PCON corresponding thereto. The power management unit 1360 may activate (e.g., turn ON) the interconnect layer 1330*a* and may deactivate (e.g., turn OFF) the remaining configuration elements of the first storage device 1300. The power management unit 1360 may deactivate configuration elements using a method such as a cut off of a clock supply, a supply of a slow clock, or an operation voltage drop.

As described in FIGS. 6 through 8, the storage system 1000 may independently deactivate configuration elements of the first storage device 1300 according to a determination result of the monitoring circuit 1350. Further, the first storage device 1300 may transmit a deactivation command to the second storage device 1400 that is not directly connected to the operation processing device 1100 according to the determination result of the monitoring circuit 1350. Thus, the storage system 1000 may reduce (or, alternatively, minimize) unnecessary power consumption according to the determination result of the monitoring circuit 1350.

Additionally, the monitoring circuit 1350 may continuously monitor the configuration elements of the first storage device 1300 which is in an idle state and a state change of the second storage device 1400. According to a monitoring result, the configuration elements of the first storage device 1300 and the second storage device 1400 may be changed from an idle state to a use state. In this case, the monitoring circuit 1350 may transmit a command state signal CSTAT representing a use state to the application layer 1340 and the power management unit 1360. The power management unit 1360 that received the command state signal CSTAT representing a use state may activate (e.g., turn ON) configuration elements of the first storage device 1300 corresponding thereto. The power management unit 1360 may activate (e.g., turn ON) the configuration elements of the first storage device 1300 through a supply of a normal clock or a rise of an operation voltage. The application layer 1340 that received the command state signal CSTAT representing a use state may transmit an activate command to the second storage device 1400.

When all configuration elements of the first storage device 1300 except the interconnect layer 1330*a* are in a deactivation state, the operation processing device 1100 may transmit an activation command to change the first and second storage devices (1300, 1400) to a use state.

Figure 9:
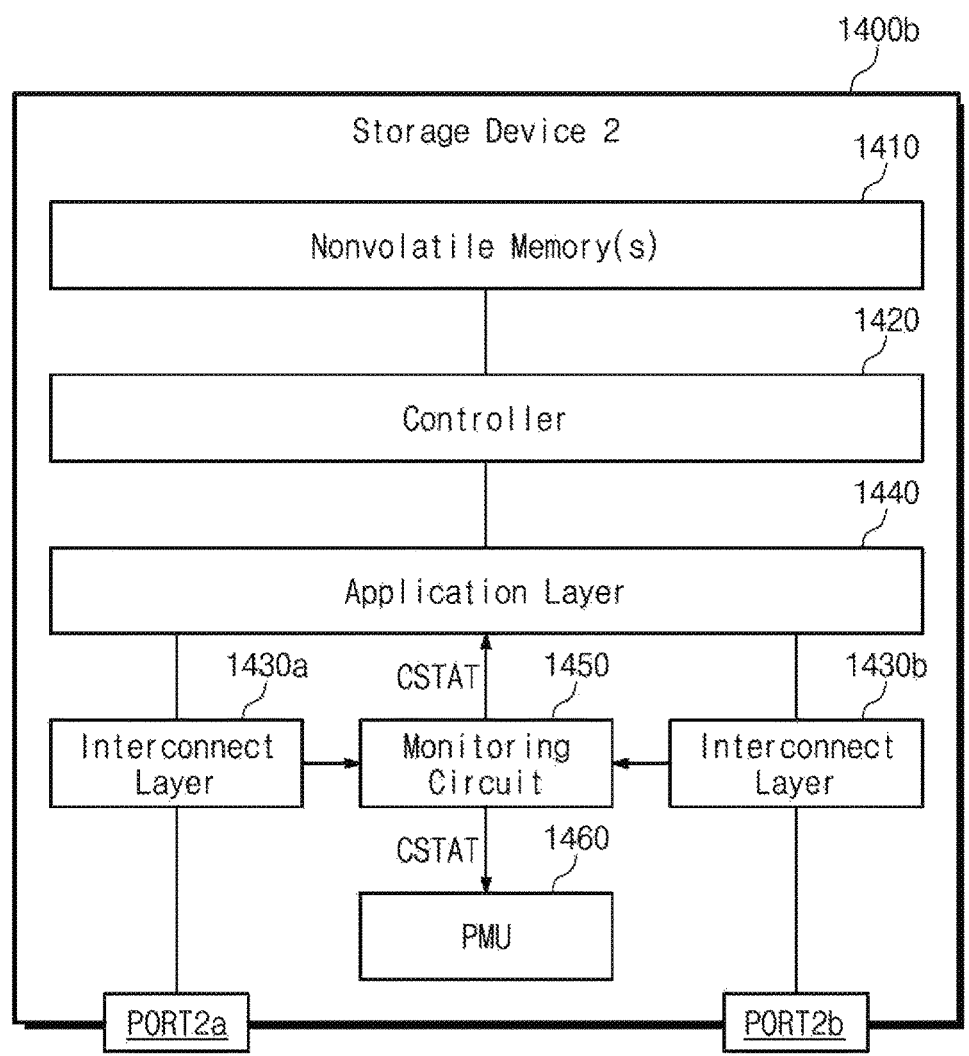
FIG. 9 is a block diagram illustrating an illustrative configuration of a second storage device of FIG. 3.

FIG. 9 is a block diagram illustrating an illustrative configuration of a second storage device of FIG. 3 according to other example embodiments. For convenience of description, overlapped descriptions on the configuration elements described above are omitted.

Referring to FIG. 9, the storage system 1000 described with reference to FIGS. 1 through 8 may include the two storage devices (1300, 1400) serially connected to each other. However, in some example embodiments, the storage system 1000 may include three or more storage devices that are serially connected to one another (refer to FIG. 10). Therefore, when the second storage device is not a last storage device in the chain, the second storage device may be embodied as a second storage device 1400b of FIG. 9.

The second storage device 1400b may include an interconnect layer 1430b, a monitoring circuit 1450, and a power management unit 1460 in addition to the nonvolatile memories 1410, the controller 1420, the interconnect layer 1430a, and the application layer 1440. The interconnect layer 1430b may transmit and receive data/signals/packets through a port (PORT2b) similar to the interconnect layer 1330b of FIG. 3. The port (PORT2b) may be directly connected to the operation processing device 1100 and other storage device (hereinafter it is referred to as a third storage device) not directly connected to the first storage device 1300.

The monitoring circuit 1450, similar to the monitoring circuit 1350 of FIG. 3, may detect a command (hereinafter it is referred to as a second storage command) processed in the second storage device 1400b and a command (hereinafter it is referred to as a third storage command) transmitted to a third storage device to determine whether configuration elements of the second storage device 1400b are deactivated. The monitoring circuit 1450 may detect a processing state of the second storage command and the third storage command. The monitoring circuit 1450 may generate a command state signal CSTAT that indicates a state of the second storage device 1400b and the third storage device based on a reception state and the processing state of the second storage command and the third storage command. The command state signal CSTAT may represent a use state or an idle state. The command state signal CSTAT may be transmitted to the power management unit 1460 and the application layer 1440.

The power management unit 1460 may deactivate some or all of configuration elements of the second storage device 1400b based on the command state signal CSTAT. When the power management unit 1460 receives a command state signal CSTAT representing that only the second storage device 1400b is in a use state, the power management unit 1460 may deactivate configuration elements associated with transmission of a command and/or data processed in the third storage device. When the power management unit 1460 receives a command state signal CSTAT representing that only the third storage device is in a use state, the power management unit 1460 may deactivate configuration elements associated with processing a command and/or data corresponding to the second storage device 1400b.

When the power management unit 1460 receives the command state signal CSTAT representing that only the second storage device 1400b is in a use state, the application layer 1440 may generate a command that deactivates the third storage device, and may transmit the generated command to the third storage device through the interconnect layer 1430b. Thus, the storage system 1000 may deactivate configuration elements of the storage device that is in an idle state to reduce (or, alternatively, prevent) unnecessary power consumption.

Figure 10:
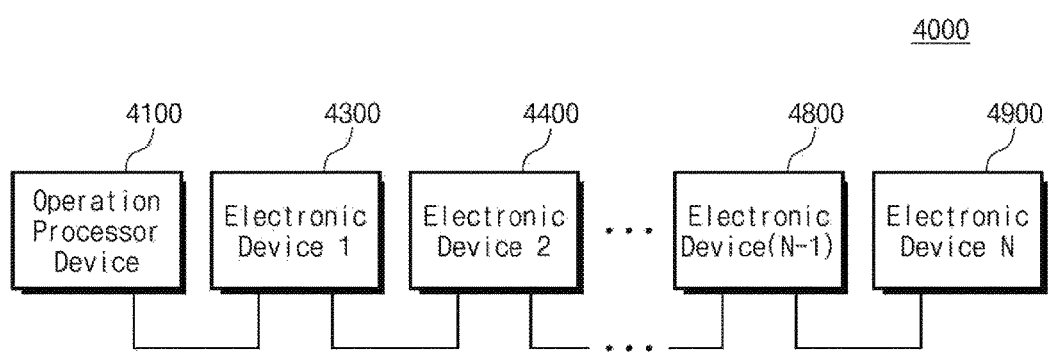
FIG. 10 is a block diagram illustrating an electronic system including electronic devices serially connected to one another according to example embodiments of the inventive concepts.
Figure 11A:
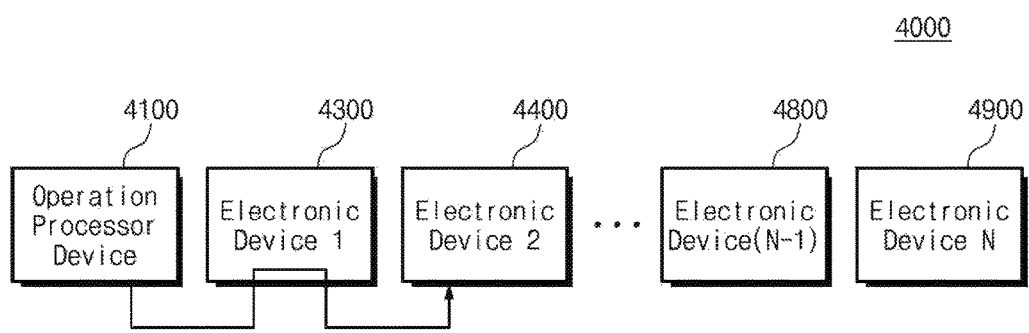
FIGS. 11A and 11B are conceptual diagram for explaining illustrative processes of communicating with an electronic device not directly connected to an operation processing device in an electronic system of FIG. 10.
Figure 11B:
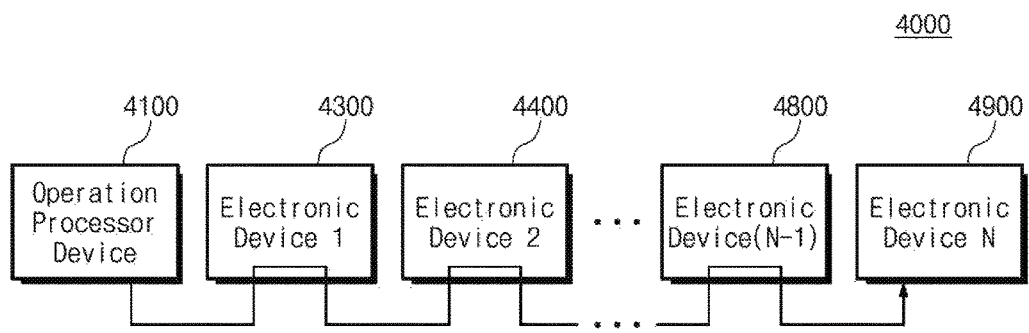

FIG. 10 is a block diagram illustrating an electronic system 4000 including a plurality of electronic devices serially connected to one another according to example embodiments of the inventive concepts. FIGS. 11A and 11B are conceptual diagram for explaining illustrative processes of communicating with an electronic device not directly connected to an operation processing device 4100 in an electronic system 4000 of FIG. 10.

Referring to FIG. 10, the electronic system 4000 may include an operation processing device 4100 and a plurality of electronic devices (4300, 4400 . . . , 4800, 4900) serially connected to the operation processing device 4100. The operation processing device 4100 may correspond to one of the operation processing devices (1100, 2100, 3100) described with reference to FIGS. 1 through 9.

The electronic system 4000 may be one of various types of electronic systems. The electronic system 4000 may correspond to the storage system 1000, the electronic device 2000, or the computing system 3000 described with reference to FIGS. 1 through 9. Each of the electronic devices (4300, 4400 . . . , 4800, 4900) may correspond to one of the storage devices (1300, 1400, 1400b, 2300, 2400, 3300a, 3300b, 3300c, 3400a, 3400b, 3400c) described with reference to FIGS. 1 through 9.

However, example embodiments of the inventive concepts are not limited by the above examples. As an example, each of the electronic devices (4300, 4400 . . . , 4800, 4900) may include any type of electronic device such as a graphic device, a wired/wireless communication device, a display device, etc. A use for the electronic system 4000 may be variously changed or modified depending on the type of each of the electronic devices (4300, 4400 . . . , 4800, 4900).

The electronic devices (4300, 4400 . . . , 4800, 4900) may be serially connected to one another through the respective input/output ports. The first electronic device 4300 may be placed on a tail end of a serial connection. The second electronic device 4400 may be connected to directly communicate with the first electronic device 4300. In this manner, the electronic devices (4300, 4400 . . . , 4800, 4900) may be connected to one another in the form of a topology of a chain structure or a daisy chain structure.

The operation processing device 4100 may be connected to directly communicate with the first electronic device 4300. However, the operation processing device 4100 may not be directly connected to other ones of the electronic devices (4400 . . . , 4800, 4900). When the operation processing device 4100 intends to communicate with a target electronic device not directly connected to the operation processing device 4100, the operation processing device 4100 may communicate with the target electronic device through an intermediate electronic device(s).

Referring to FIG. 11A, when the operation processing device 4100 intends to communicate with the second electronic device 4400, the operation processing device 4100 may communicate with the second electronic device 4400 through the first electronic device 4300. The first electronic device 4300 may monitor commands from the operation processing device 4100.

When only an operation performed in the second electronic device 4400 is required without an operation performed in the first electronic device 4300 according to a monitoring result, the first electronic device 4300 may activate only a communication path to the second electronic device 4400 and may deactivate the remaining parts of the first electronic device 4300. Thus, the first electronic device 4300 may reduce (or, alternatively, prevent) unnecessary power consumption.

When only an operation preformed in the first electronic device 4300 is required, the first electronic device 4300 may deactivate other electronic devices (4400 . . . , 4800, 4900). Thus, the first electronic device 4300 may reduce (or, alternatively, prevent) unnecessary power consumption in the other electronic devices (4400 . . . , 4800, 4900).

Referring to FIG. 11B, when the operation processing device 4100 intends to communicate with the Nth electronic device 4900, the operation processing device 4100 may communicate with the Nth electronic device 4900 through the first through (N−1) electronic devices (4300 to 4800). The first electronic device 4300 may monitor commands from the operation processing device 4100.

When only an operation preformed in the Nth electronic device 4900 is required without an operation performed in the first through (N−1) electronic devices (4300 to 4800) according to a monitoring result, the first electronic device 4300 may activate only a communication path to the Nth electronic device 4900 and the remaining parts of the first through (N−1) electronic devices (4300 to 4800) may be deactivated. Thus, unnecessary power consumption in the first through (N−1) electronic devices (4300 to 4800) may be reduced (or, alternatively, prevented).

Each of the electronic devices (4300, 4400 . . . , 4800, 4900) may be controlled by an independent monitoring circuit. In some example embodiments, only the first electronic device 4300 may include a monitoring circuit such that the first electronic device 4300 generates the command state signals CSTAT to control (e.g., activate or deactivate) each of the other electronic devices (4400 . . . , 4800, 4900) down the chain. In other example embodiments, each of the first through Nth electronic devices (4300, 4400 . . . , 4800, 4900) may include a monitoring circuit such that each of the each of the first through Nth electronic devices (4300, 4400 . . . , 4800, 4900) generates the command state signal CSTAT to control (e.g., activate or deactivate) an adjacent one of the electronic devices down the chain.

To implement the electronic system 4000 of FIGS. 10, 11A and 11B, the operation processing device 4100 and the electronic devices (4300, 4400, . . . , 4800, 4900) may adopt at least one of the configurations, the operations, the processes, the methods, and the communications described with reference to FIGS. 1 through 9. The operation processing device 4100 and the electronic devices (4300, 4400, . . . , 4800, 4900) may adopt at least one of various interface protocols such as USB, SCSI, PCIe, NVMe, SATA, SAS, SD card, eMMC, UFS, etc. but this is not to limit the example embodiments of the inventive concepts.

Figure 12:
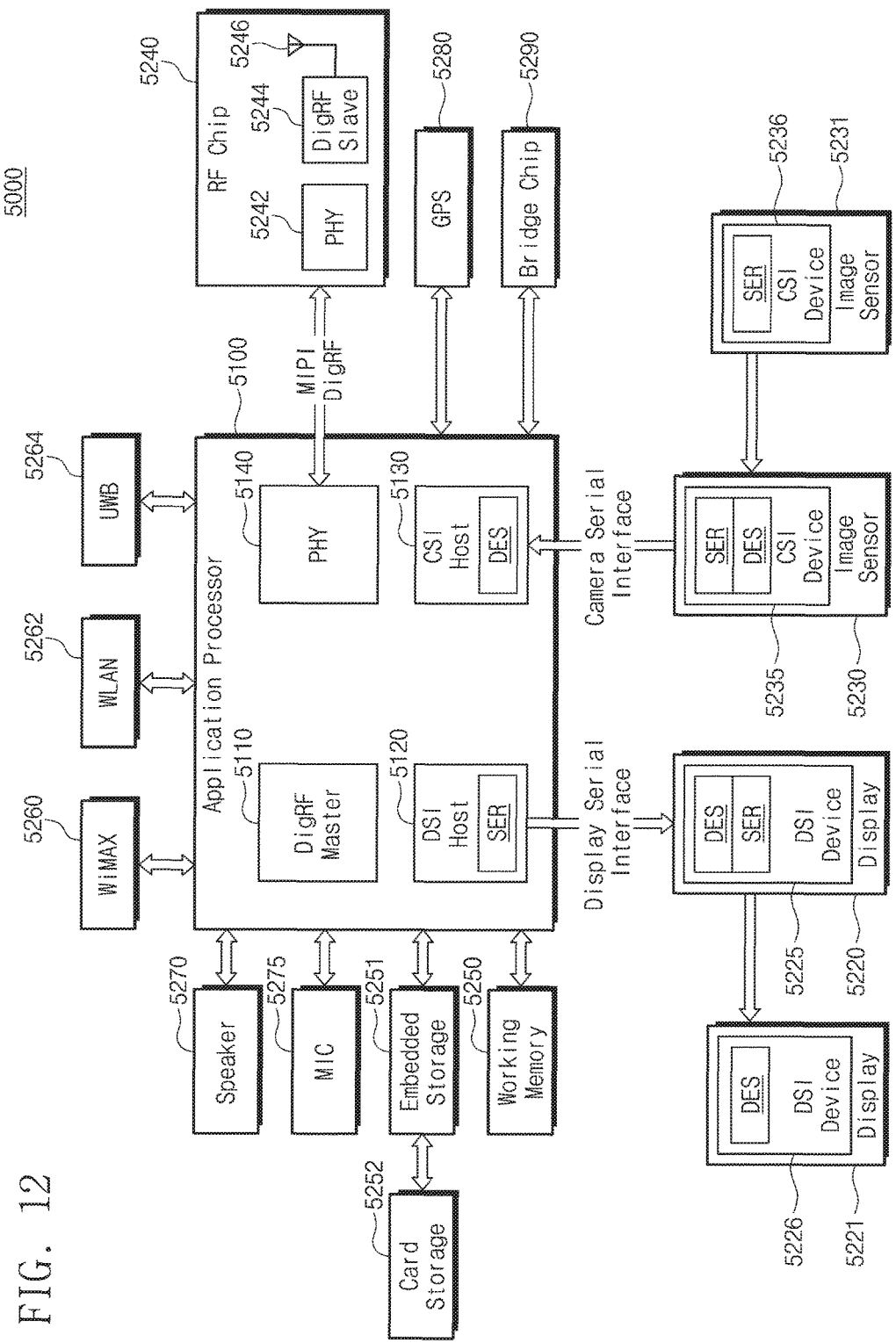
FIG. 12 is a block diagram illustrating an illustrative configuration of an electronic device according to example embodiments of the inventive concepts and interfaces thereof.

FIG. 12 is a block diagram illustrating an illustrative configuration of an electronic device according to example embodiments of the inventive concepts and interfaces thereof.

Referring to FIG. 12, an electronic device 5000 may be implemented by a data processing device capable of using or supporting an interface protocol suggested by a mobile industry processor interface (MIPI) alliance. The electronic device 5000 may be one of electronic devices such as a portable communication terminal, a personal digital assistant (PDA), a portable media player (PMP), a smart phone, a tablet computer, a wearable device, etc.

The electronic device 5000 may include an application processor 5100, displays 5220 and 5221, and image sensors 5230 and 5231. The application processor 5100 may include a DigRF master 5110, a DSI (display serial interface) host 5120, a CSI (camera serial interface) host 5130, and a physical layer 5140.

The DSI host 5120 may communicate with a DSI device 5225 of the display 5220 according to DSI. As an example, an optical serializer SER may be implemented in the DSI host 5120 and an optical deserializer DES may be implemented in the DSI device 5225. The display 5220 may communicate with a DSI device 5226 of the display 5221 according to DSI. As an example, an optical serializier SER may be further implemented in the DSI device 5225 and an optical deserializer DES may be implemented in a DSI device 5226.

The display 5221 may not be directly connected to the application processor 5100. Thus, the application processor 5100 may communicate with the DSI device 5226 of the display 5221 through the display 5220. The display 5220 may include the monitoring circuit described in FIGS. 1 through 8. According to a monitoring result of the monitoring circuit, the display 5220 may deactivate configuration elements of the displays (5220, 5221) independently.

The CSI host 5130 may communicate with a CSI device 5235 of the image sensor 5230 according to CSI. As an example, an optical deserializer DES may be implemented in the CSI host 5130 and an optical serializer SER may be implemented in the CSI device 5235. The image sensor 5230 may communicate with a CSI device 5236 of the image sensor 5231 according to CSI. An optical deserializer DES may be further implemented in the CSI device 5235 and an optical serializer SER may be implemented in the CSI device 5236.

The image sensor 5231 may not be directly connected to the application processor 5100. Thus, the application processor 5100 may communicate with the CSI device 5236 of the image sensor 5231 through the image sensor 5230. The image sensor 5230 may include the monitoring circuit described in FIGS. 1 through 8. According to a monitoring result of the monitoring circuit, the image sensor 5230 may deactivate configuration elements of the image sensors (5230, 5231) independently.

The electronic device 5000 may further include a RF (radio frequency) chip 5240 that communicates with the application processor 5100. The RF chip 5240 may include a physical layer 5242, a DigRF slave 5244, and an antenna 5246. The physical layer 5242 of the RF chip 5240 and the physical layer 5140 of the application processor 5100 may exchange data with each other by the DigRF interface suggested by the MIPI alliance.

The electronic device 5000 may further include a working memory 5250, an embedded storage device 5251, and card storage device 5252. The working memory 5250, the embedded storage device 5251, and the card storage device 5252 may store or output data for the application processor 5100.

The working memory 5250 may temporarily store data processed or to be processed by the application processor 5100. The working memory 5250 may include a volatile memory such as a SRAM (static random access memory), a DRAM (dynamic RAM), a SDRAM (synchronous DRAM), etc. and/or a nonvolatile memory such as a flash memory, a PRAM (phase-change RAM), a MRAM (mgneto-resistive RAM), a ReRAM (resistive RAM), a FRAM (ferro-electric RAM), etc.

The embedded storage device 5251 and the card storage device 5252 can store data regardless of whether power is supplied. The embedded storage device 5251 and the card storage device 5252 may correspond to the embedded storage device 2300 and the removable storage device 2400 of FIG. 2 respectively. Therefore, the application processor 5100 may not be directly connected to a card associated with the card storage 5252. Thus, the application processor 5100 may communicate with the card storage 5252 through the embedded storage 5251. The embedded storage 5251 may include the monitoring circuit described in FIGS. 1 through 8. According to a monitoring result of the monitoring circuit, the embedded storage 5251 may deactivate configuration elements of the embedded storage 5251 and/or the card storage 5252 independently.

The electronic device 5000 may communicate with an external device/system through a communication module such as a Wimax (world interoperability for microwave access) 5260, a WLAN (wireless local area network) 5262, a UWB (Ultra Wideband) 5264, etc. In addition, the electronic device 5000 may communicate with an external device/system according to at least one of various wireless communication methods such as a LTE (long term evolution), a GSM (global system for mobile communication), a CDMA (code division multiple access), a Bluetooth, a NFC (near field communication), a WiFi, a RFID (radio frequency Identification), etc. and/or at least one of various wired communication methods such as a TCP/IP (transfer control protocol/internet protocol), a USB (universal serial bus), a SCSI (small computer small interface), a M-PCIe (mobile PCIe), a Firewire, etc.

The electronic device 5000 may further include a speaker 5270 and a microphone 5275 for processing voice information. Further, the electronic device 5000 may further include a GPS (global positioning system) device 5280 for processing location information. The electronic device 5000 may further include a bridge chip 5290 for managing a connection with peripheral devices.

According to example embodiments of the inventive concepts, an electronic device monitors commands being received to partly reduce (or, alternatively, minimize) power consumption according to a state of the command and a storage device included therein may be provided.

The contents described above are specific example embodiments for implementing the inventive concepts. The inventive concepts may include not only the example embodiments described above but also example embodiments in which a design is simply or easily capable of being changed. The inventive concepts may also include technologies easily changed to be implemented using the example embodiments.

What is claimed is:

1. An electronic device comprising:
an application processor; and
an embedded storage device including,
a controller configured to directly communicate with both an extended storage device and the application processor such that the application processor is configured to communicate with the extended storage device through the embedded storage device, and to control power supplied to a part or all of the embedded storage device according to a command state signal,
a nonvolatile memory configured to store or output data under control of the controller, and
a monitoring device configured to,
monitor commands received by the embedded storage device from the application processor,
determine states of the embedded storage device and the extended storage device based on the commands received by the embedded storage device from the application processor, and
generate the command state signal based on the states of the embedded storage device and the extended storage device such that the command state signal indicates at least whether to deactivate one or more circuits associated with the embedded storage device based on whether the states of the embedded storage device and the extended storage device are an idle state or an active state.

2. The electronic device of claim 1, wherein the monitoring device is configured to generate the command state signal indicating that the embedded storage device is in the idle state, if the monitoring device determines that an operation associated with the electronic device utilizes the extended storage device without utilizing the embedded storage device based on the states of the embedded storage device and the extended storage device.

3. The electronic device of claim 1, wherein the monitoring device is configured to generate the command state signal indicating that the extended storage device is in the idle state, if the monitoring device determines that an operation associated with the electronic device utilizes the embedded storage device without utilizing the extended storage device based on the states of the embedded storage device and the extended storage device.

4. The electronic device of claim 1, wherein the monitoring device is configured to generate the command state signal indicating that both the extended storage device and the embedded storage device are in the idle state, if the monitoring device determines that an operation associated with the electronic device does not utilize both the embedded storage device and the extended storage device.

5. The electronic device of claim 1, further comprising:
a power management device configured to selectively deactivate the one or more circuits associated with the embedded storage device based on the command state signal.

6. The electronic device of claim 5, wherein the one or more circuits include memory devices and the controller configured to control the memory devices, and the power management device is configured to adjust an operation power supply of the memory devices and an operation power supply of the controller, if the power management device receives a first command state signal indicating that the embedded storage device is in the idle state.

7. The electronic device of claim 6, wherein the power management device is configured to readjust the operation power supply of the memory devices and the operation power supply of the controller, if the power management device receives a second command state signal indicating that the embedded storage device is in the active state.

8. The electronic device of claim 5, wherein the one or more circuits associated with the embedded storage device include at least one circuit configured to facilitate communication with the application processor, and
the power management device is configured to adjust an operation power supply of each of the one or more circuits except for the at least one circuit, if the power management device receives the command state signal indicating that both the embedded storage device and the extended storage device are in the idle state.

9. The electronic device of claim 5, wherein the embedded storage device is configured to transmit a deactivation command to the extended storage device to adjust an operation power supply of the extended storage device, if the power management device receives the command state signal indicating that the extended storage device is in the idle state.

10. An embedded storage device comprising:
a controller configured to directly communicate with both a host device and an extended storage device, the host device being an application processor;
a nonvolatile memory configured to store or output data under control of the controller;

a monitoring device configured to,
  monitor commands received by the embedded storage device from the host device,
  determine states of the embedded storage device and the extended storage device based on the commands received by the embedded storage device from the application processor, and
  generate a command state signal based on the states of the embedded storage device and the extended storage device such that the command state signal indicates at least whether to deactivate one or more circuits associated with the embedded storage device based on whether the states of the nonvolatile memory and the extended storage device are an idle state or an active state; and
a power management device configured to adjust an operation power supply to a part of or all of the nonvolatile memory and the controller based on the command state signal.

11. The embedded storage device of claim 10, wherein the monitoring device is configured to generate the command state signal indicating that the nonvolatile memory is in the idle state, if the monitoring device determines that an operation associated with an electronic device utilizes the extended storage device without utilizing the nonvolatile memory based on the states of the embedded storage device and the extended storage device.

12. The embedded storage device of claim 10, wherein the monitoring device is configured to generate the command state signal indicating that the extended storage device is in the idle state, if the monitoring device determines that an operation associated with an electronic device utilizes the nonvolatile memory without utilizing extended storage device.

13. The embedded storage device of claim 10, wherein the power management device is configured to adjust the operation power supply to a portion of the controller that controls the nonvolatile memory, if the power management device receives the command state signal indicating that the nonvolatile memory is in the idle state.

14. The embedded storage device of claim 10, wherein the power management device is configured to adjust the operation power supply to a portion of the controller configured to communicate with the extended storage device, if the power management device receives the command state signal indicating that the extended storage device is in the idle state.

15. The embedded storage device of claim 10, wherein the controller is configured to transmit a deactivation command to the extended storage device to reduce power consumption of the extended storage device, if the power management device receives the command state signal indicating that the extended storage device is in the idle state.

* * * * *